(12) United States Patent
Wijeratne et al.

(10) Patent No.: US 7,161,389 B2
(45) Date of Patent: Jan. 9, 2007

(54) RATIOED LOGIC CIRCUITS WITH CONTENTION INTERRUPT

(75) Inventors: Sapumal Wijeratne, Portland, OR (US); Daniel J. Deleganes, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/881,891

(22) Filed: Jun. 30, 2004

(65) Prior Publication Data

US 2006/0001452 A1    Jan. 5, 2006

(51) Int. Cl.
*H03K 19/094* (2006.01)
(52) U.S. Cl. ...................... 326/121; 326/114
(58) Field of Classification Search .............. 326/114, 326/121
See application file for complete search history.

(56) References Cited

U.S. PATENT DOCUMENTS 5,748,012 A * 5/1998 Beakes et al. ................ 326/93
6,087,855 A * 7/2000 Frederick et al. ........... 326/106
6,617,892 B1 * 9/2003 Krishnamurthy et al. ... 327/112

OTHER PUBLICATIONS

Rabaey, Jan M., "Digital Integrated Circuits: A Design Perspective," *Prentice Hall Electronics and VLSI Series*, index (xiv), pp. 202-210, 1996, Prentice-Hall, Inc., no month.

* cited by examiner

*Primary Examiner*—James H. Cho
(74) *Attorney, Agent, or Firm*—Blakely, Sokoloff, Taylor & Zafman LLP

(57) ABSTRACT

A ratioed logic gate includes a contention interrupt circuit. The ratioed logic gate includes a pull up network coupled to a pull down network. Multiple inputs are coupled to turn the pull down and pull up networks on and off. An output is coupled to apply a logical function on the multiple inputs. A contention interrupt circuit is coupled to one of the pull up and the pull down networks to open circuit the one of the pull up and pull down networks when the pull up and pull down networks are in contention.

46 Claims, 10 Drawing Sheets

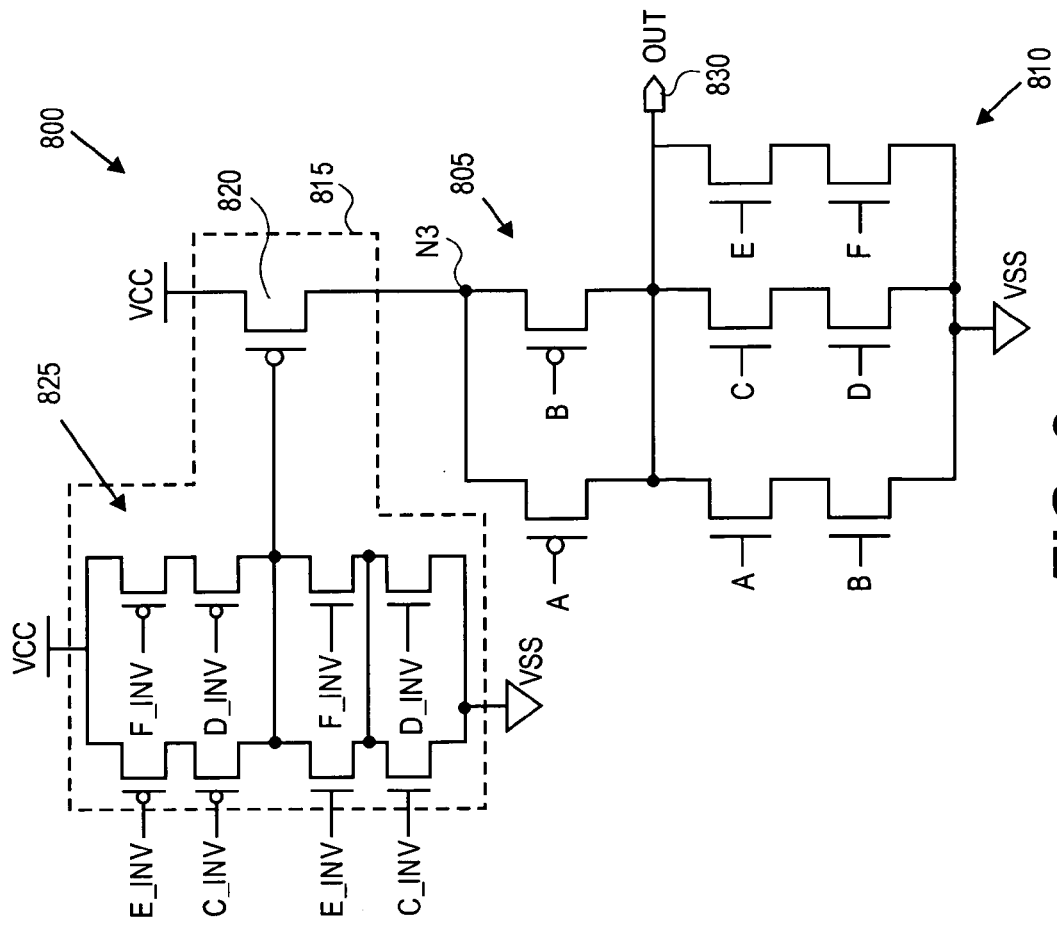
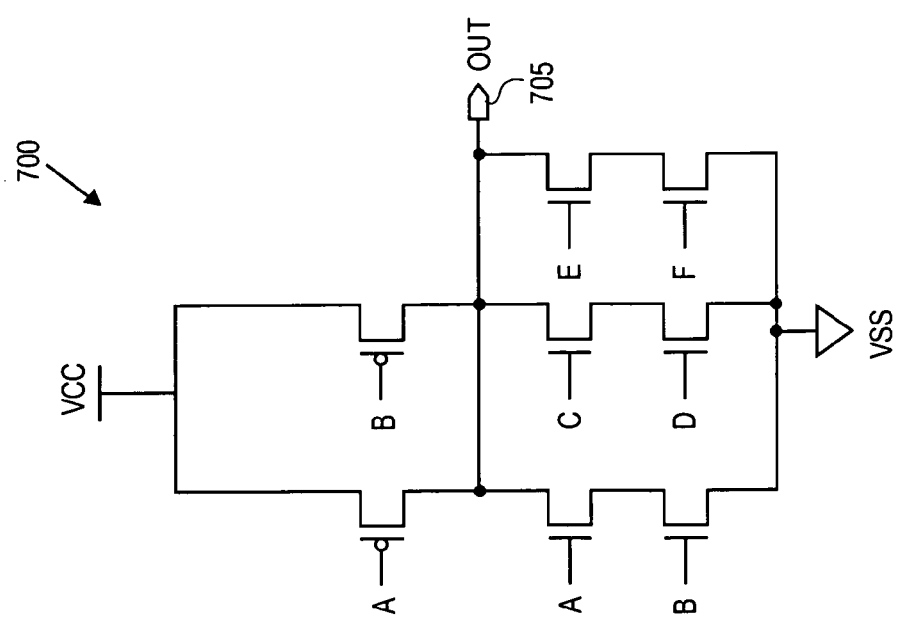
FIG. 8
FIG. 7 (PRIOR ART)

US 7,161,389 B2

RATIOED LOGIC CIRCUITS WITH CONTENTION INTERRUPT

TECHNICAL FIELD

This disclosure relates generally to logic circuits, and in particular, relates to ratioed logic gates.

BACKGROUND INFORMATION

Digital logic circuits are based on logic gates that adhere to mathematical logic and Boolean algebra. Mathematical logic provides tools to reason about the truth of a set of statements, each of which may be true or false. Boolean algebra is an algebraic system for manipulating logic statements. Logic gates are building blocks for integrated circuits that implement various logic operations, such as AND, OR, NOT, Not OR ("NOR"), and the like. These logic gates are themselves formed using basic electrical switches called transistors.

Logic gates may be formed using complementary metal oxide semiconductor ("CMOS") technology or ratioed logic technology. CMOS logic gates provide good HIGH LEVEL and LOW LEVEL outputs, but tend to be slow. On the other hand, ratioed logic is faster but can generate detrimental non-zero LOW level outputs or poor HIGH level outputs, as the case may be.

FIG. 1 illustrates a known implementation of a four input ratioed NOR gate 100. A NOR gate implements the Boolean NOR logical operation that is true if all inputs are false, and false if any input is true. Ratioed NOR gate 100 is formed using ratioed-logic. A ratioed-logic NOR gate includes parallel pull up PMOS (positive type metal oxide semiconductor) transistors coupled to parallel pull down NMOS transistors. For various input combinations, one or more of the PMOS transistors and one or more of the NMOS transistors can be simultaneously ON. In other words, the pull up transistors can be in contention with the pull down transistors over the value of the output node.

During this contention state, the output node generates a non-zero LOW level, otherwise known as a contention level. The magnitude of this output contention level is directly proportional to the resistance ratio of the simultaneously ON pull up and pull down transistors. The duration of this contention state is equal to the time the inputs remain in a contention producing combination. For this reason the output of a ratioed NOR gate behaves like a DC (steady state) noise source when in the contention state. This DC noise source can compromise the signal integrity of downstream circuitry.

Typically, the output of a ratioed NOR gate is coupled to a gate terminal of a transistor in the next stage or receiving stage. If the non-zero LOW level is above the threshold voltage for the transistor, then the otherwise OFF transistor will turn ON resulting in the generation and propagation of an erroneous value. However, even if the ratioed NOR gate output contention level is below the threshold voltage for the receiving transistor, the non-zero LOW level or (DC noise source) may still detrimentally impact downstream circuitry. This detrimental impact results from transistor sub-threshold conduction. Contention induced non-zero LOW levels can account for significant conduction currents through an OFF receiving transistor. Contention induced currents are increasingly more problematic with each successive semiconductor process generation.

Currently, the magnitude of the output contention level is reduced by appropriate downsizing of the PMOS pull up transistors, thereby bring the contention induced non-zero LOW levels closer to zero. However, downsizing the PMOS pull up transistors detrimentally increases the pull up delay.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 7 is a circuit diagram illustrating a known ratioed logic circuit to implement the function $\overline{(A \cdot B)+(C \cdot D)+(E \cdot F)}$.

FIG. 8 is a circuit diagram illustrating a ratioed logic circuit with contention interrupt to implement the function $\overline{(A \cdot B)+(C \cdot D)+(E \cdot F)}$, in accordance with an embodiment of the present invention.

DETAILED DESCRIPTION

Embodiments of a system and apparatus for ratioed logic gates with a contention interrupt circuits are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
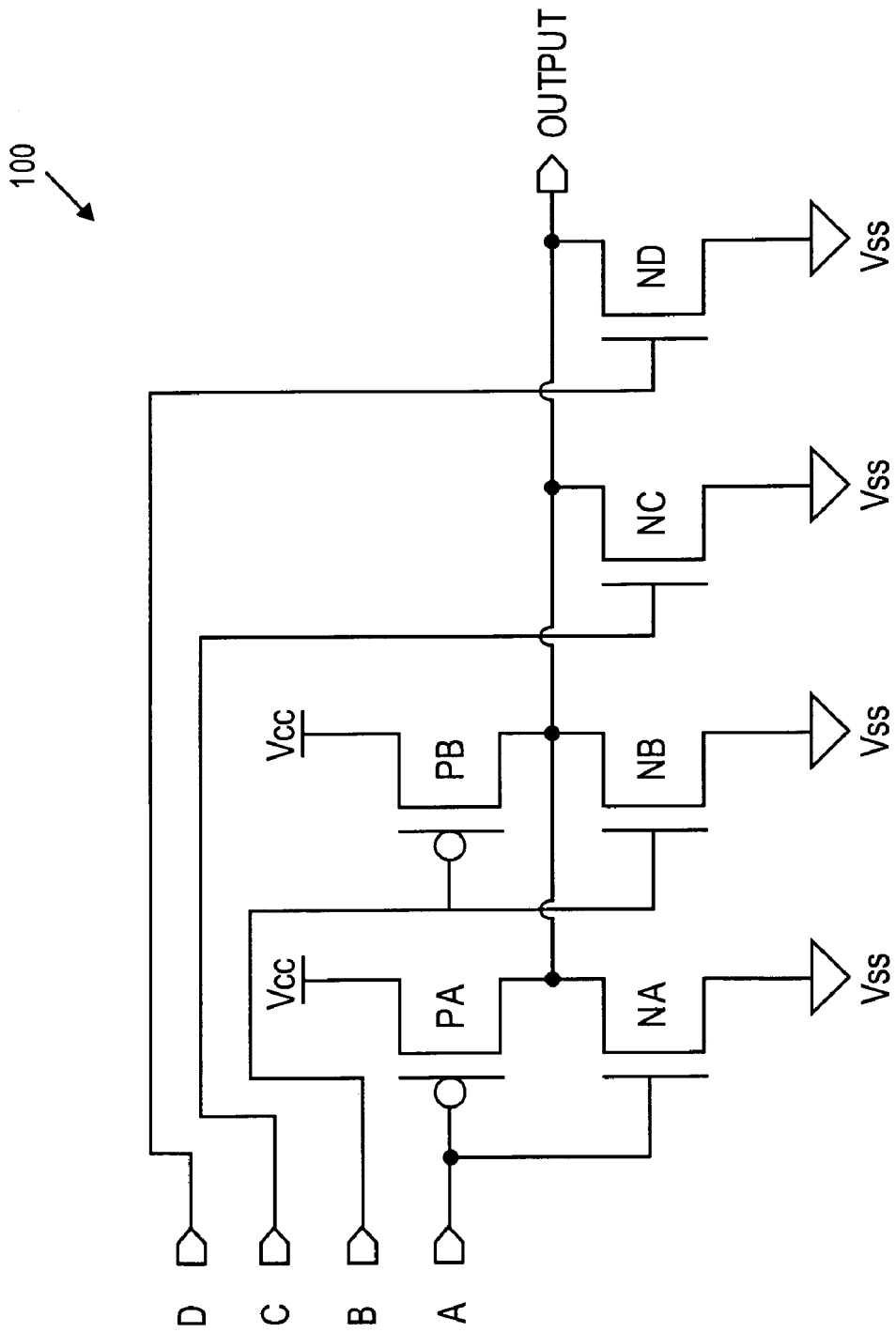
FIG. 1 is a circuit diagram illustrating a known NOR gate that generates a persistent non-zero output contention level when driving LOW under certain input conditions.
Figure 2:
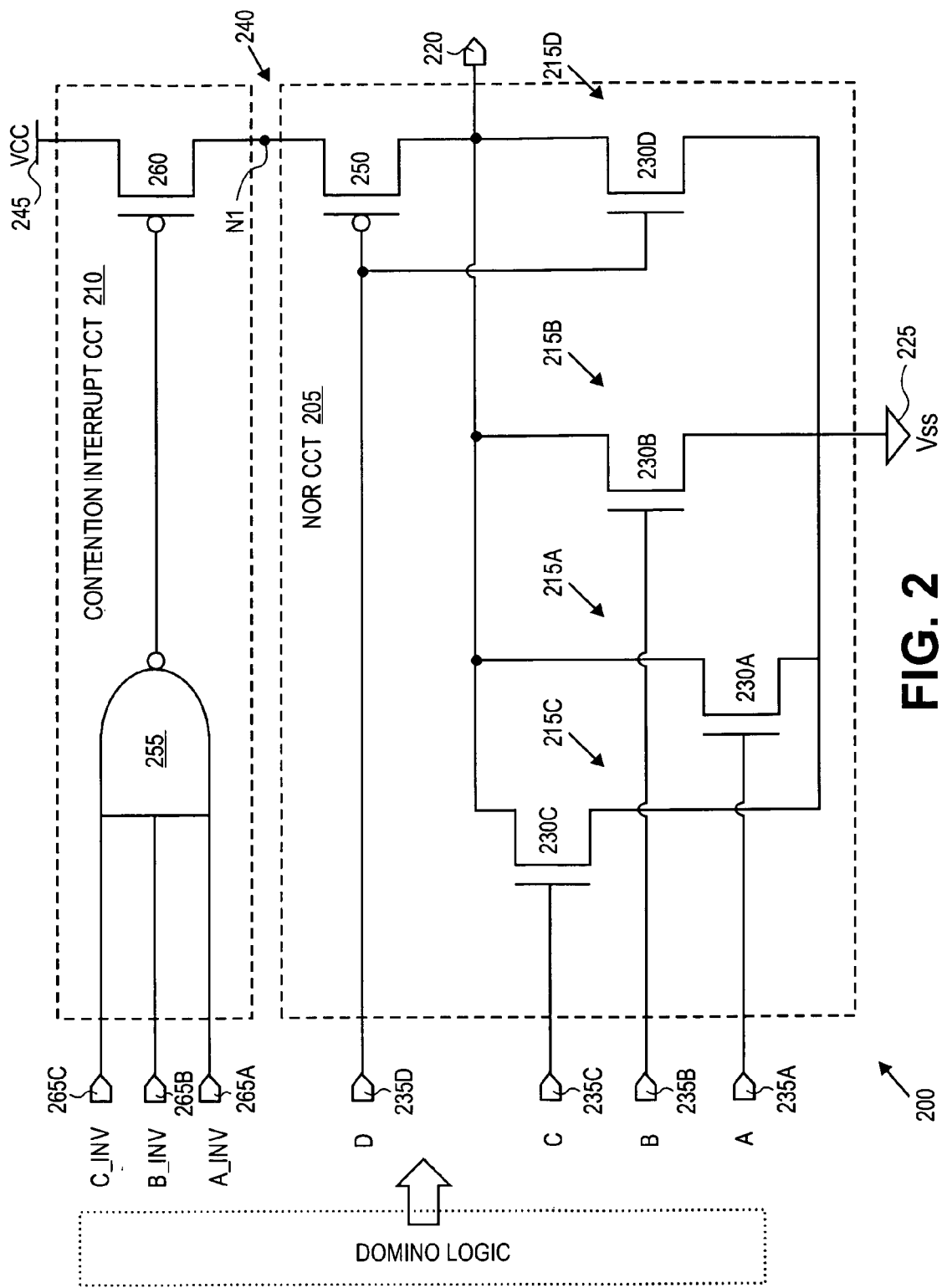
FIG. 2 is a circuit diagram illustrating a NOR logic gate including an contention interrupt circuit, in accordance with an embodiment of the present invention.

FIG. 2 is a circuit diagram illustrating a NOR logic gate 200, in accordance with an embodiment of the present invention. NOR logic gate 200 includes a NOR circuit 205 and a contention interrupt circuit 210. NOR logic gate 200 is illustrated as a four input NOR logic gate; however, it should be appreciated that the techniques described herein are equally applicable to NOR logic gates having more or less inputs (e.g., two, three, five, etc.).

The illustrated embodiment of NOR circuit 205 includes a number of pull down paths 215A, B, C, and D (collectively 215). Pull down paths 215 are coupled in parallel between an output 220 and a ground rail 225 providing a LOW logic level voltage $V_{SS}$. Each of pull down paths 215 includes a corresponding one of switches 230A, B, C, D (collectively 230). Switches 230 are each controlled by one of inputs 235A, B, C, and D (collectively 235) to turn ON or OFF, thereby enabling or disabling pull down paths 215. Each one of pull down paths 215 can independently pull output 220 to $V_{SS}$ in response to its corresponding input 235.

Output 220 is further coupled via a pull up path 240 to a power rail 245. Power rail 245 provides a HIGH logic level voltage $V_{CC}$. NOR circuit 205 includes a switch 250 coupled into pull up path 240. Switch 250 is controlled by input 235D to turn switch 250 ON or OFF, thereby enabling or disabling pull up path 240.

The illustrated embodiment of contention interrupt circuit 210 includes a decoder 255 coupled to control a switch 260. Decoder 255 is further coupled to receive three inputs 265A, B, and C (collectively 265). Decoder 255 decodes the values on inputs 265 to selectively turn switch 260 ON or OFF, thereby enabling or disabling pull up path 240. In the illustrated embodiment, decoder 255 performs a logical NAND operation on three input operands to generate a resultant for controlling switch 260. In this embodiment, decoder 255 represents a three input NAND logic gate. In the illustrated embodiment, inputs 265 are inverted values or logical inversions of inputs 235A, 235B, and 235C.

One of ordinary skill in the art having the benefit of the instant disclosure will appreciate that decoder 255 may be implemented using other circuits and/or combinations of logic gates. Furthermore, although decoder 255 is illustrated with only three inputs 265 carrying inverted values of inputs 235A, B, and C, decoder 255 may receive four inputs coupled to receive inverted values of inputs 235A–D; although it is not necessary in the illustrated embodiment due to the functionality of switch 250 (explained below). Also, the number of inputs 265 to decoder 255 scales with the number of inputs 235 to NOR circuit 205. In an embodiment where decoder 255 is a NAND logic gate, decoder 255 will have at least N-1 inputs 265, where N equals the number of inputs 235. For example, in an embodiment where NOR logic gate 200 is a three input NOR logic gate, decoder 255 may have only two inputs 265.

In one embodiment, switches 230 are negative type metal oxide semiconductor ("NMOS") transistors having drain terminals coupled to output 220, source terminals coupled to ground rail 225, and gate terminals coupled to a corresponding one of inputs 235. In one embodiment, switches 250 and 260 are positive type MOS ("PMOS") transistors having source and drain terminals coupled in series along pull up path 240. In this embodiment, the gate terminal of switch 250 is coupled to input 235D and the gate terminal of switch 260 is coupled to an output of decoder 255.

NOR logic gate 200 is implemented using ratioed logic. In other words, in the event of a contention state where one or more of pull down paths 215 and pull up path 240 are both enabled, by design output 220 will tend towards $V_{SS}$. To do so, a single one of pull down paths 215 must be capable of overcoming pull up path 240. Therefore, the internal resistances of each pull down path 215 and pull up path 240 are ratioed such that a single one of pull down paths 230 will win in contention. These internal resistances may be adjusted by adjusting the size of switches 230, 250, and 260. However, when designing the internal resistance of pull up path 240, switch 250 may be size to obtain the desired resistance ratio and switch 260 may be oversized so as to add minimal additional internal resistance to pull up path 240 and therefore maintain a fast rising transition. Additionally, keeping switch 250 small and increasing the size of switch 260, reduces the load capacitance reflected onto input 235D and output 220 while maintaining fast rising transition. One example ratio configuration is as follows: switches 230A, B, and C have a relative size of 4, switch 230D has a relative size of 2.5, switch 250 has a relative size of 8, and switch 260 has a relative size of 16. It should be appreciated that other relative sizes/strengths of these switches (e.g., PMOS and NMOS transistors) may be selected.

NOR logic gate 200 operates as follows. If one or more of inputs 235 is HIGH, then one or more of pull down paths 215 is enabled, causing output 220 to be LOW. If all of inputs 235 are LOW then pull down paths 215 are disabled and pull up path 240 is enabled, causing output 220 to be HIGH. Thus, NOR logic gate 200 implements a logical NOR operation on inputs 235. Contention interrupt circuit 210 acts to reduce the duration of contention states between pull up path 240 and pull down paths 215. Without contention interrupt circuit 210, contention states arise and persist as long as inputs 235 remain in a contention producing combination. Contention producing combinations include any combination of inputs 235 with input 235D LOW and one or more of inputs 235A, B, and C HIGH.

However, with embodiments of the present invention the duration of the contention state is temporary due to contention interrupt circuit 210. Decoder 255 acts to decode all possible contention producing combinations of inputs 235A, B, and C and turns switch 260 OFF, thereby disabling pull up path 240 and eliminating the contention state. In the illustrated embodiment, performing a logical NAND on inverted values of inputs 235A, B, and C is sufficient to decode all possible contention producing combinations of inputs 235. It should be noted that input 235D need not be decoded in contention interrupt circuit 210 since it is the only input 235 coupled to simultaneously disable both pull up path 240 and enable pull down path 215D.

Figure 3:
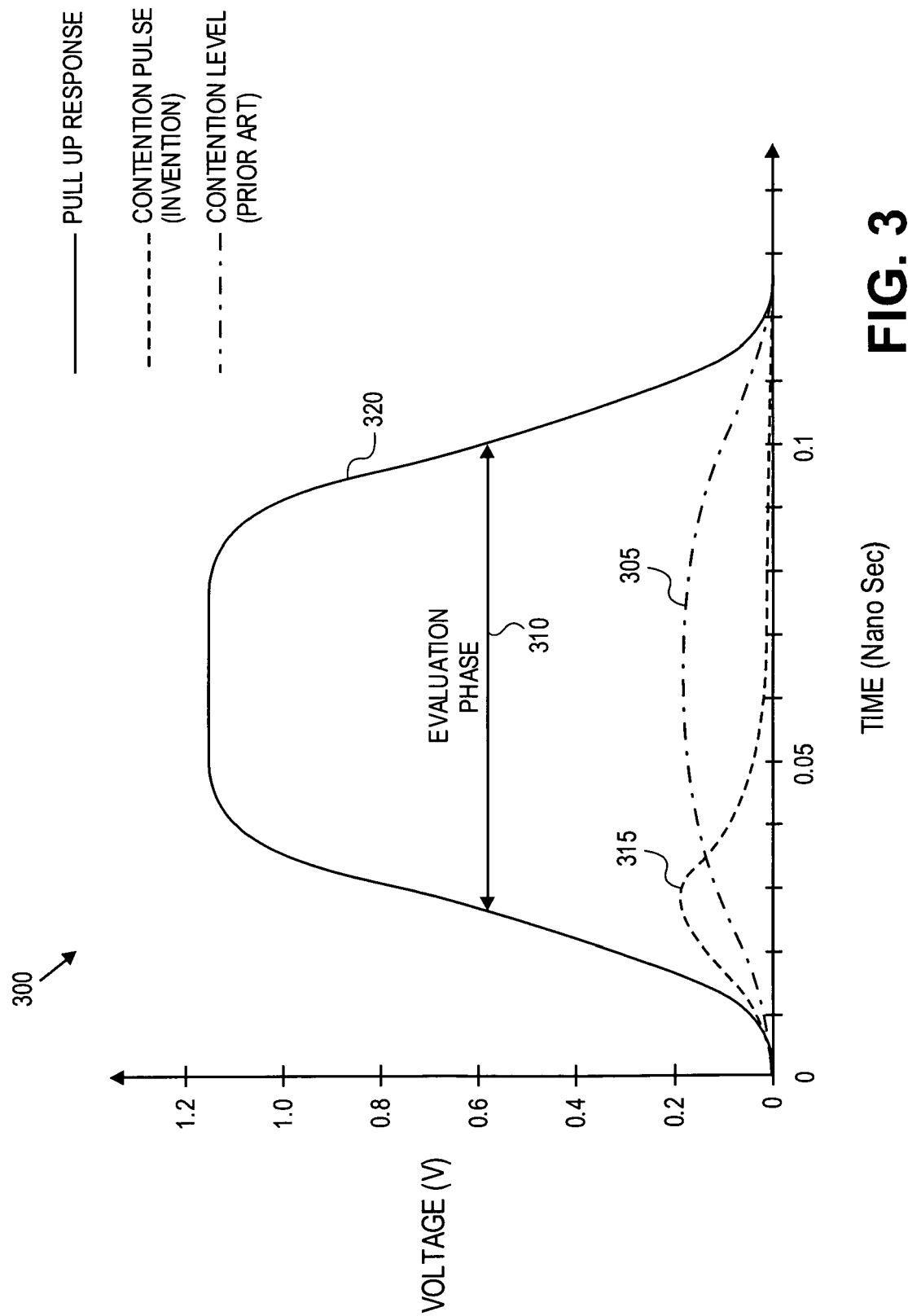
FIG. 3 is a line chart comparing a contention pulse generated by a ratioed NOR logic gate including a contention interrupt circuit against a non-zero output contention level generated by known ratioed NOR gates, in accordance with an embodiment of the present invention.

FIG. 3 is a line chart 300 comparing the duration of contention states produced by NOR logic gate 200 and known NOR gate 100. Line chart 300 graphs voltage at output 220 versus time in nanoseconds. Line chart 300 is representative only. Actual times and voltages may vary depending upon implementation details.

A line 305 represents the contention level or non-zero LOW level generated at the output of known NOR gate 100 when in a contention state. As can be seen, the output remains at the non-zero LOW level (e.g., 0.2 V) for a substantial portion of the evaluation phase, illustrated by line 310. In a synchronous circuit, the evaluation phase may represent a portion of a clock duty cycle during which the output is sampled or resolved. Since the output contention level persists for a majority of the evaluation phase, NOR gate 100 acts as a zero-level (i.e., logic LOW level) noise source during the contention state.

In contrast, embodiments of NOR logic gate 200 generate only a brief contention pulse, illustrated by line 315, at output 220 when a contention producing combination are applied to inputs 235. The duration of the contention pulse is determined by the delay of decoder 255 to decode inputs 265 and turn off switch 260. In an embodiment where decoder 255 is a NAND logic gate, the delay is equal to one gate delay. The magnitude of the contention pulse is determined by the ratio of the internal resistances of pull down paths 215 to pull up path 240. In one embodiment, increasing the size of the NMOS pull down transistors will reduce the magnitude of the contention pulse. Alternatively, decreasing the size of the PMOS pull up transistors (e.g., switches 250 and 260) will also decrease the magnitude of the contention pulse, but at the expense of the pull up or rise time response of output 220, illustrated by line 320.

Without a contention interrupt circuit, ratioed logic generates a steady state (e.g., DC) noise level during the contention state that can propagate causing malfunction of downstream logic. In contrast, NOR logic gate 200 generates a contention/noise pulse (i.e., line 315) that quickly dissipates due to the inherent low pass filtering behavior of digital logic circuits. In other words, the noise pulse is so short lived that downstream circuitry cannot respond quickly enough to the input noise pulse and effectively attenuates the noise pulse. Each successive downstream stage attenuates the noise pulse further, resulting in a substantially reduced likelihood of malfunction.

In one embodiment, NOR logic gate 200 may be implemented in connection with domino logic. In these embodiments, domino logic may couple to inputs 235 and 265. During a precharge phase, the domino logic may precharge all inputs 235 and 265 HIGH. Precharging all inputs 235 and 265 HIGH causes switch 250 to close disabling pull up path 240 and enables pull down paths 215 causing output 220 to be pulled toward $V_{SS}$ (LOW logic state). However, asserting a HIGH logic state on each of inputs 265 results in decoder 255 turning switch 260 ON causing internal node N1 to charge up to $V_{CC}$ ahead of time. Consequently, during an evaluation phase, if the input combination to inputs 235 are such that output 220 resolves to a HIGH logic state, then the precharge state of internal node N1 facilitates a fast rise transition time from LOW to HIGH for output 220.

The processes explained below are described in terms of computer software and hardware. The techniques described may constitute machine-executable instructions embodied within a machine (e.g., computer) readable medium, that when executed by a machine will cause the machine to perform the operations described. Additionally, the processes may be embodied within hardware, such as an application specific integrated circuit ("ASIC") or the like. The order in which some or all of the process blocks appear in each process should not be deemed limiting. Rather, one of ordinary skill in the art having the benefit of the present disclosure will understand that some of the process blocks may be executed in a variety of orders not illustrated.

Figure 4:
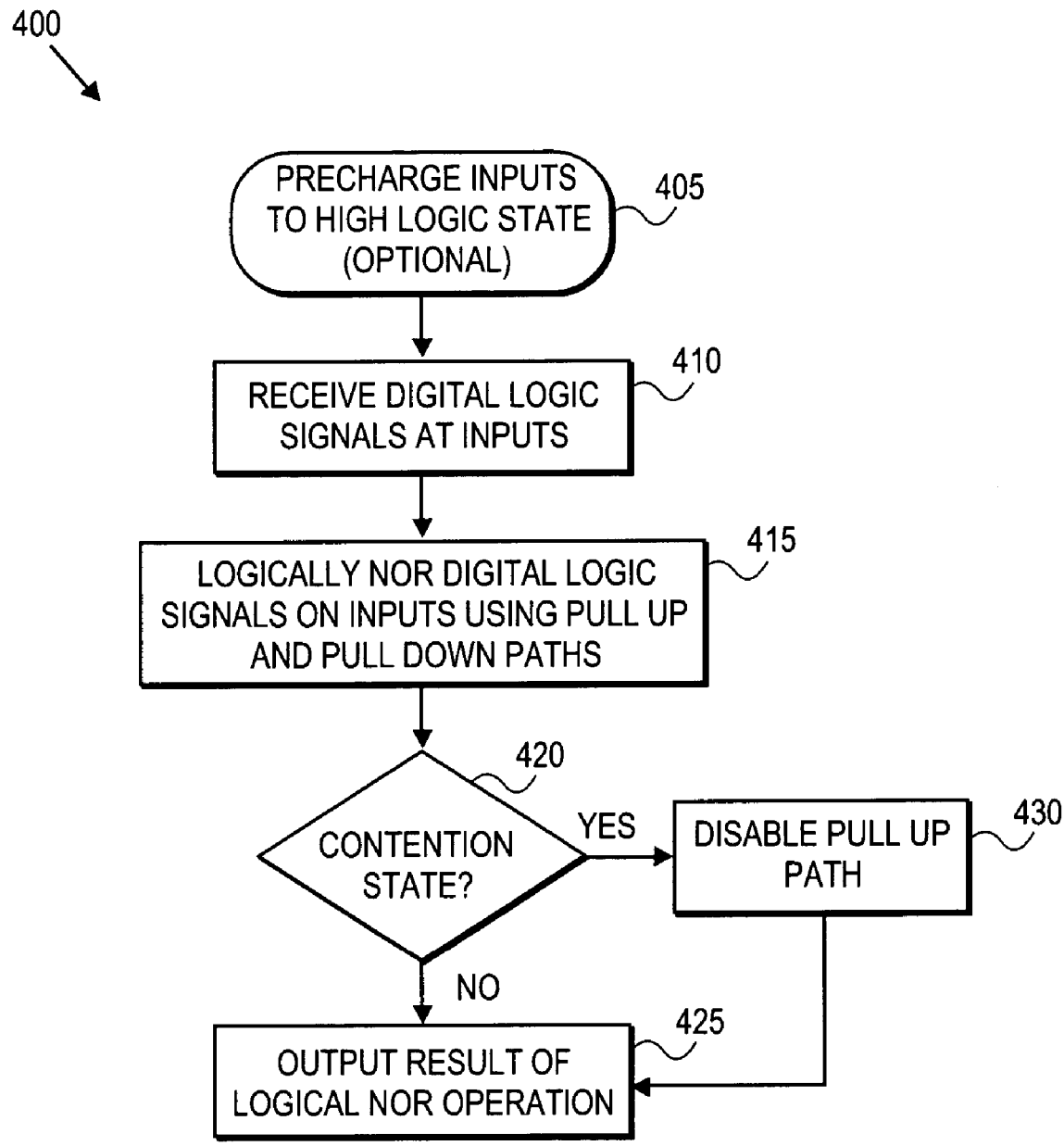
FIG. 4 is a flow chart illustrating operation of a NOR logic gate including a contention interrupt circuit, in accordance with an embodiment of the present invention.

FIG. 4 is a flow chart illustrating a process 400 for operating NOR logic gate 200, in accordance with an embodiment of the present invention. In a process block 405, inputs 235 and 265 are precharged to a HIGH logic state by a preceding domino logic element. Process block 405 is an optional process block that may or may not be implemented as desired. Furthermore, NOR logic gate 200 need not necessarily be coupled to an output of a domino logic element, in which case precharging inputs 235 and 265 may not be executed.

In a process block 410, digital logic signals are received at inputs 235. In process block 415, a logical NOR operation is executed on the digital logic signals received on inputs 235. The logical NOR operation is executed as described above by the ratioed logic pull up path 240 and pull down paths 215. In a decision block 420, contention interrupt circuit 210 determines whether a contention producing combination has been received on inputs 235. In one embodiment, contention interrupt circuit 210 determines whether a contention state exists by executing a logical NAND on logical inversions of inputs 235A, 235B, and 235C.

If no contention state is determined to exist, then process 400 continues to a process block 425. In process block 425, the result of the logical NOR operation is output on output 220. However, if a contention state is determined to exist, then process 400 continues from decision block 420 to a process block 430. In process block 430, contention interrupt circuit 210 disables pull up path 240 by turning switch 260 OFF (e.g., asserting a LOW logic value to the gate of the PMOS transistor). Process 400 then returns to process block 425 to output the result of the logical NOR operation. It should be appreciated that outputting the result of the logical NOR operation in process block 425 may occur contemporaneously with process blocks 415, 430, and decision block 420.

NOR logic gate 200 (see FIG. 2) illustrates one technique of how to implement a NOR logic function using ratioed logic with a contention interrupt circuit. However, the techniques described herein are applicable with almost any logic function implemented using ratio logic. Contention interrupt circuits may be tailored for other ratioed logic functions.

Figures 5, 6:
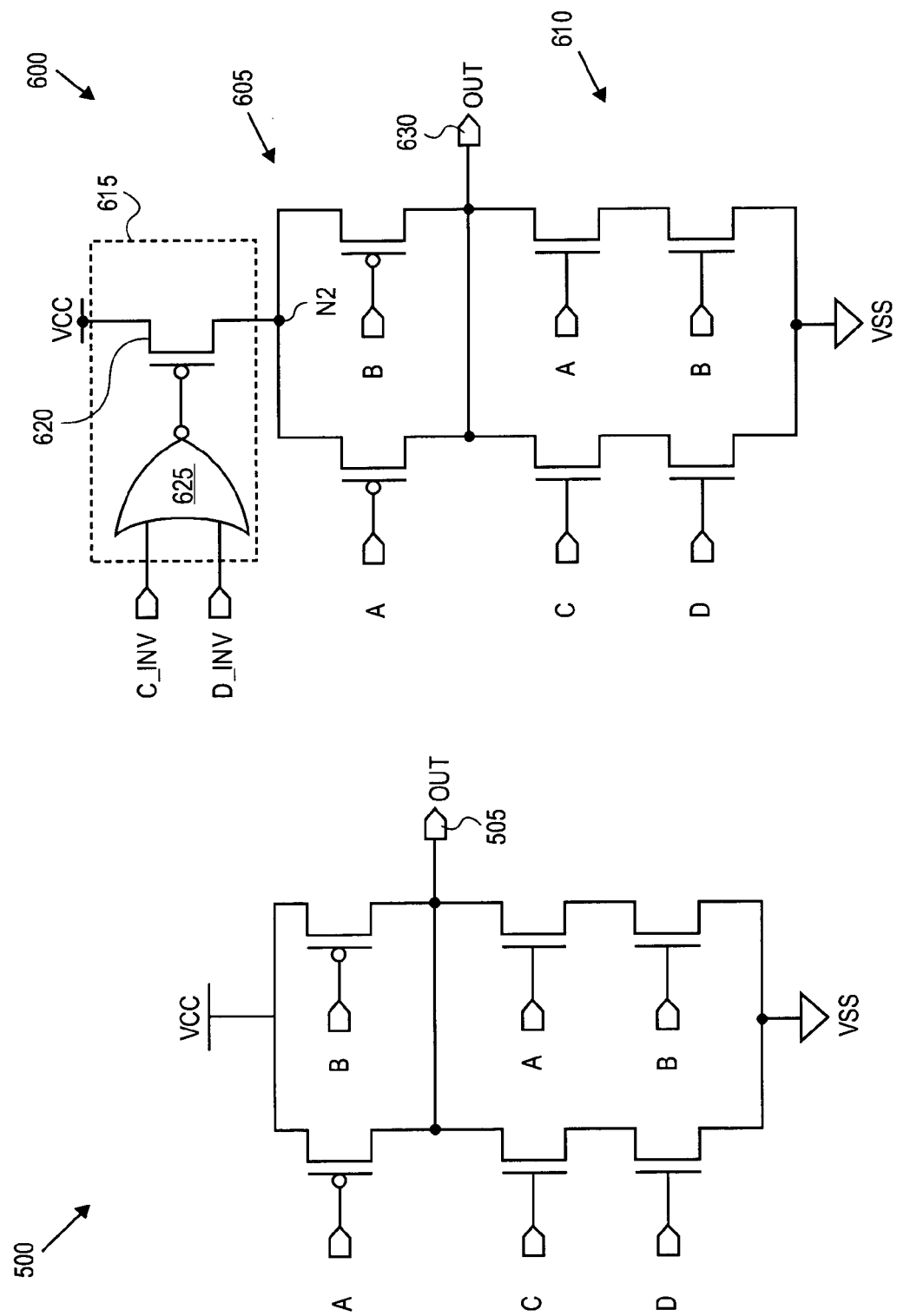
FIG. 5 is a circuit diagram illustrating a known ratioed logic circuit to implement the function $\overline{(A \cdot B)+(C \cdot D)}$.
FIG. 6 is a circuit diagram illustrating a ratioed logic circuit with contention interrupt to implement the function $\overline{(A \cdot B)+(C \cdot D)}$, in accordance with an embodiment of the present invention.

FIG. 5 is a circuit diagram of a known ratioed logic circuit 500. Ratioed logic circuit 500 generates an output signal OUT on output 505 as a function of its inputs A, B, C, and D, according to the following logical equation:

$$\text{OUT} = \overline{(A \cdot B) + (C \cdot D)} \qquad \text{(Equation 1)}$$

where "·" represents a logical AND function and "+" represents a logical OR function. Ratioed logic circuit 500 may be applied as a 2-to-1 inverting multiplexer if the inputs "A" and "C" are considered selectors and the inputs "B" and "D" are data inputs to be multiplexed and inverted onto output 505.

FIG. 6 is circuit diagram illustrating a ratioed logic circuit 600, in accordance with an embodiment of the present invention. Ratioed logic circuit 600 implements the same logic function (i.e., equation 1) as ratioed logic circuit 500, but uses a contention interrupt circuit. Ratioed logic circuit 600 includes a pull up network 605, a pull down network 610, and a contention interrupt circuit 615.

The illustrated embodiment of pull down network 610 includes two parallel pull down paths, which are selectively enabled or disabled with inputs A and B or C and D, respectively. Pull up network 605 includes two parallel pull up paths selectively enabled or disabled with inputs A and B. In one embodiment, each of the parallel pull down paths of pull down network 610 are sized in relation to each of the parallel pull up paths of pull up network 605, such that output 630 is pulled towards a logic LOW (i.e., VSS) whenever pull up network 605 and pull down network 610 are in contention. In other words, the switches of pull down network 610 are ratioed in relation to the switches of pull up network 605 to pull output 630 LOW when in contention.

Contention interrupt circuit 615 includes a switch 620 and a decoder 625. In the illustrated embodiment, decoder 625 is a two input NOR gate coupled to receive inverted values of inputs C and D (henceforth C_INV and D_INV). Switch 620 is coupled in series between VCC and pull up network 605. Decoder 625 decodes its inputs C_INV and D_INV to selectively turn switch 620 ON or OFF, thereby enabling or disabling pull up network 605. Decoder 625 acts to turn switch 620 OFF (a.k.a. open circuit switch 620) to disable pull up network 605 when a contention producing combination of inputs A, B, C, D are asserted. In this manner, contention interrupt circuit 615 acts to eliminate a contention state on output 630, as described above.

In some embodiments, ratioed logic circuit 600 is implemented in connection with domino logic circuits. In these embodiments, a domino logic element may couple to inputs A, B, C, D, C_INV, and D_INV. During a precharge phase, the domino logic element may precharge all the inputs HIGH. During the precharge phase both C and C_INV and D and D_INV are HIGH. Precharging all the inputs HIGH turns the switches of pull down network 610 ON (i.e., conduct) and the switches of pull up network 605 OFF (i.e., open circuit), causing output 630 to be pulled toward $V_{SS}$ (LOW logic state). However, asserting a HIGH logic state on each of the inverting inputs C_INV and D_INV of contention interrupt circuit 615, results in decoder 625 turning switch 620 ON causing an internal node N2 to charge up to $V_{CC}$ ahead of time. Subsequently, during an evaluation phase, if the input combination to inputs A, B, C, D, C_INV, and D_INV are such that output 630 resolves to a HIGH logic state, then the precharge state of internal node N2 facilitates a fast rise transition time from LOW to HIGH for output 630.

FIG. 7 is a circuit diagram of a known ratioed logic circuit 700. Ratioed logic circuit 700 generates an output signal OUT on output 705 as a function of its inputs A, B, C, D, E, and F according to the following logical equation:

$$\mathrm{OUT} = \overline{(A \cdot B) + (C \cdot D) + (E \cdot F)}. \quad \text{(Equation 2)}$$

Ratioed logic circuit 700 may be applied as a 3-to-1 inverting multiplexer if the inputs A, C, and E are considered selectors and the inputs B, D, and F are data inputs to be multiplexed and inverted onto output 705.

FIG. 8 is a circuit diagram illustrating a ratioed logic circuit 800, in accordance with an embodiment of the present invention. Ratioed logic circuit 800 implements the same logic function (i.e., equation 2) as ratioed logic circuit 700, but uses a contention interrupt circuit. Ratioed logic circuit 800 includes a pull up network 805, a pull down network 810, and a contention interrupt circuit 815.

The illustrated embodiment of pull down network 810 includes three parallel pull down paths, which are selectively enabled or disabled with inputs A and B, C and D, or E and F, respectively. Pull up network 805 includes two parallel pull up paths selectively enabled or disabled with inputs A and B.

Contention interrupt circuit 815 includes a switch 820 and a decoder 825. In the illustrated embodiment, decoder 825 is coupled to receive inverted values of inputs C, D, E, and F (henceforth C_INV, D_INV, E_INV, and F_INV). Switch 820 is coupled in series between $V_{CC}$ and pull up network 805. Decoder 825 decodes its inputs C_INV, D_INV, E_INV, and F_INV to selectively turn switch 820 ON or OFF, thereby enabling or disabling pull up network 805. Decoder 825 acts to turn switch 820 OFF to disable pull up network 805 when a contention producing combination of inputs A, B, C, D, E, and F are simultaneously asserted to pull up network 805 and pull down network 810. In this manner, contention interrupt circuit 815 acts to eliminate a contention state on output 830, as described above.

Some embodiments of ratioed logic circuit 800 may be implemented in connection with domino logic circuits. In these embodiments, an internal node N3 is precharged to $V_{CC}$ and output 830 pulled LOW to $V_{SS}$ during a precharge phase. Subsequently, during an evaluation phase, if the input combination to inputs A, B, C, D, E, F, C_INV, D_INV, E_INV, and F_INV are such that output 830 resolves to a HIGH logic state, then the precharge state of internal node N3 facilitates a fast rise transition time from LOW to HIGH for output 830.

Figure 9:
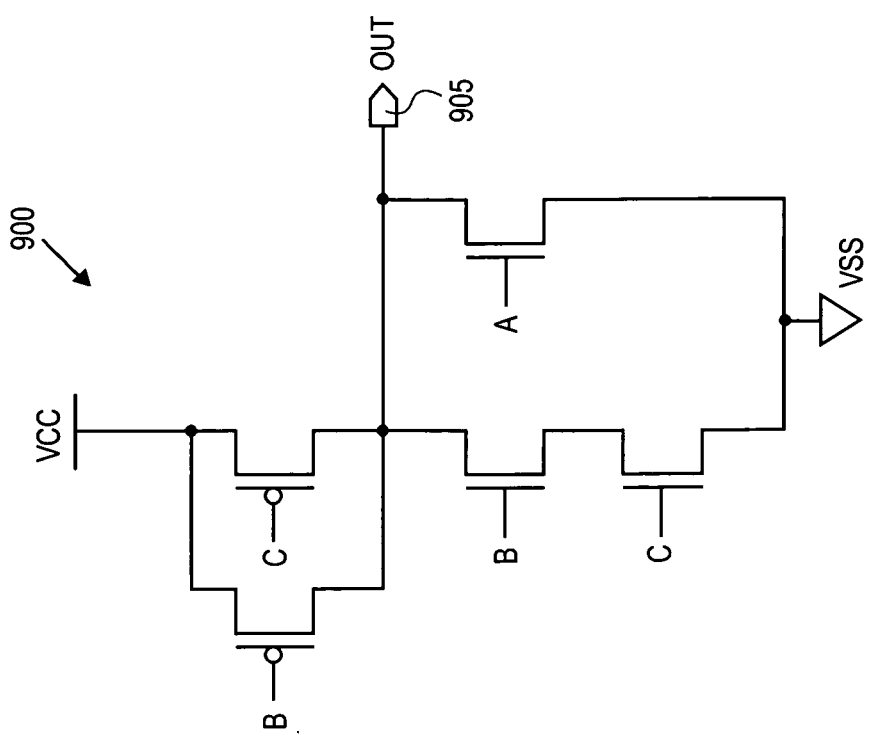
FIG. 9 is a circuit diagram of a known ratioed logic circuit to implement the function $\overline{A+(B \cdot C)}$.

FIG. 9 is a circuit diagram of a known ratioed logic circuit 900. Ratioed logic circuit 900 generates an output signal OUT on output 905 as a function of its inputs A, B, and C according to the following logical equation:

$$\mathrm{OUT} = \overline{A + (B \cdot C)} \quad \text{(Equation 3)}$$

Ratioed logic circuit 900 may be applied as a carry out in an ADDER circuit.

Figure 10:
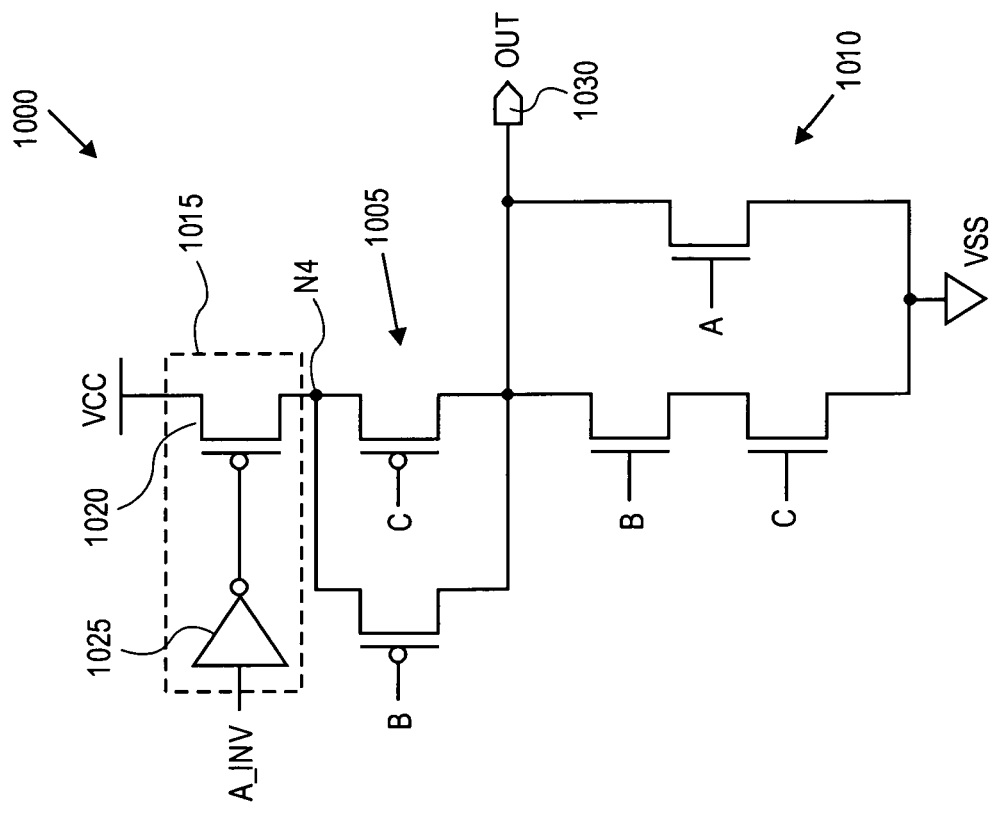
FIG. 10 is a circuit diagram of a ratioed logic circuit with contention interrupt to implement the function $\overline{A+(B \cdot C)}$, in accordance with an embodiment of the present invention.

FIG. 10 is a circuit diagram illustrating a ratioed logic circuit 1000, in accordance with an embodiment of the present invention. Ratioed logic circuit 1000 implements the same logic function (i.e., equation 3) as ratioed logic circuit 900, but uses a contention interrupt circuit. Ratioed logic circuit 1000 includes a pull up network 1005, a pull down network 1010, and a contention interrupt circuit 1015.

The illustrated embodiment of pull down network 1010 includes two parallel pull down paths, which are selectively enabled or disabled with inputs A, B, and C. Pull up network 1005 includes two parallel pull up paths selectively enabled or disabled with inputs B and C.

Contention interrupt circuit 1015 includes a switch 1020 and a decoder 1025. In the illustrated embodiment, decoder 1025 is an inverter coupled to receive an inverted value of input A (henceforth $A_{13}$ INV). Switch 1020 is coupled in series between VCC and pull up network 1005. Decoder 1025 decodes its input A_INV to selectively turn switch 1020 ON or OFF, thereby enabling or disabling pull up network 1005. Decoder 1025 acts to turn switch 1020 OFF to disable pull up network 1005 when a contention producing combination of inputs A, B, and C are asserted to pull up network 1005 and pull down network 1010. In this manner, contention interrupt circuit 1015 acts to eliminate a contention state on output 1030, as described above.

Some embodiments of ratioed logic circuit 1000 may be implemented in connection with domino logic circuits. In these embodiments, an internal node N4 is precharged to $V_{CC}$ and output 1030 pulled LOW to $V_{SS}$ during a precharge phase. Subsequently, during an evaluation phase, if the input combination to inputs A, B, and C are such that output 1030 resolves to a HIGH logic state, then the precharge state of internal node N4 facilitates a fast rise transition time from LOW to HIGH for output 1030.

Figure 11:
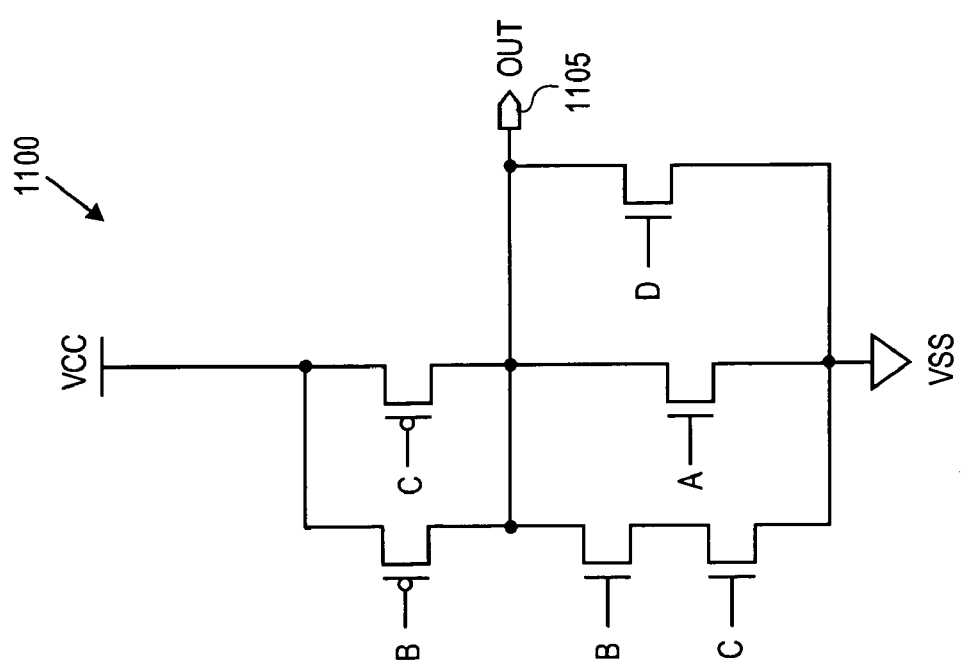
FIG. 11 is a circuit diagram of a ratioed logic circuit to implement the function $\overline{A+(B \cdot C)+D}$.

FIG. 11 is a circuit diagram of a ratioed logic circuit 1100. Ratioed logic circuit 1100 generates an output signal OUT on output 1105 as a function of its inputs A, B, C, and D according to the following logical equation:

$$\text{OUT} = \overline{A} + (B \cdot C) + D \quad \text{(Equation 4)}$$

Figure 12:
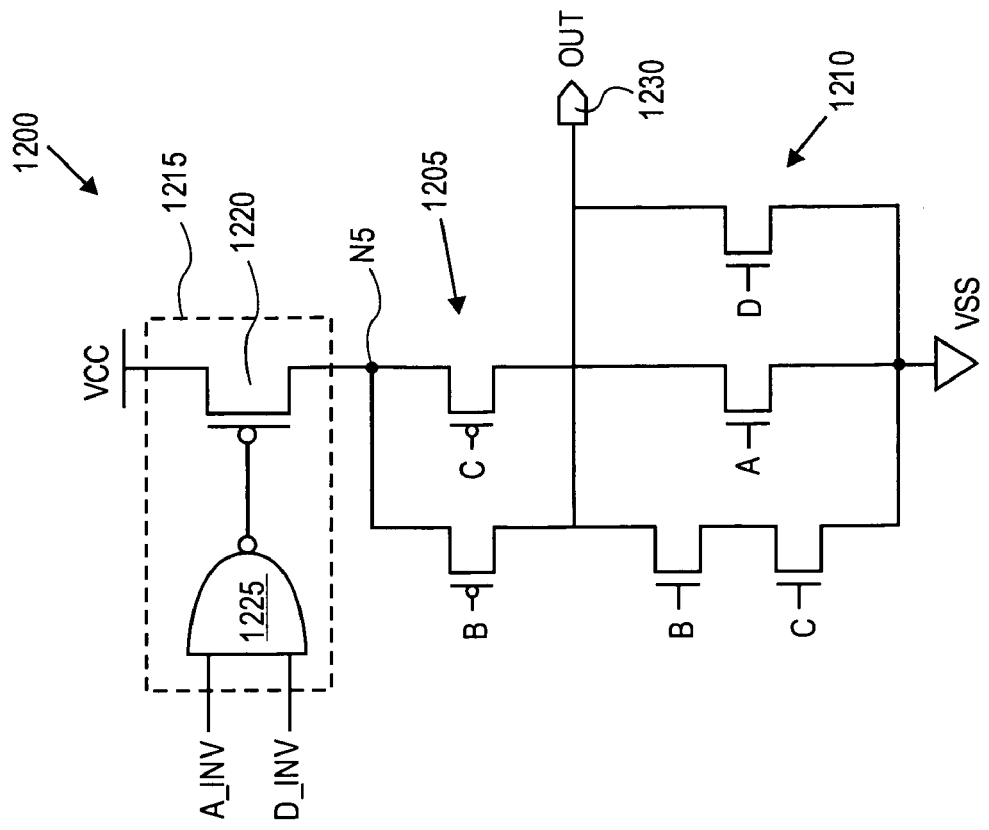
FIG. 12 is a circuit diagram of a ratioed logic circuit with contention interrupt to implement the function $\overline{A+(B \cdot C)+D}$, in accordance with an embodiment of the present invention

FIG. 12 is a circuit diagram illustrating a ratioed logic circuit 1200, in accordance with an embodiment of the present invention. Ratioed logic circuit 1200 implements the same logic function (i.e., equation 4) as ratioed logic circuit 1100, but uses a contention interrupt circuit. Ratioed logic circuit 1200 includes a pull up network 1205, a pull down network 1210, and a contention interrupt circuit 1215.

The illustrated embodiment of pull down network 1210 includes three parallel pull down paths, which are selectively enabled or disabled with inputs A, B, C, and D. Pull up network 1205 includes two parallel pull up paths selectively enabled or disabled with inputs B and C.

Contention interrupt circuit 1215 includes a switch 1220 and a decoder 1225. In the illustrated embodiment, decoder 1225 is a NAND gate coupled to receive inverted values of inputs A and D (henceforth A_INV and D_INV). Switch 1220 is coupled in series between $V_{CC}$ and pull up network 1205. Decoder 1225 decodes its inputs A_INV and D_INV to selectively turn switch 1220 ON or OFF, thereby enabling or disabling pull up network 1205. Decoder 1225 acts to turn switch 1220 OFF to disable pull up network 1205 when a contention producing combination of inputs A, B, C, and D are asserted to pull up network 1205 and pull down network 1210. In this manner, contention interrupt circuit 1215 acts to eliminate a contention state on output 1230, as described above.

Some embodiments of ratioed logic circuit 1200 may be implemented in connection with domino logic circuits. In these embodiments, an internal node N5 is precharged to $V_{cc}$ and output 1230 pulled LOW to $V_{SS}$ during a precharge phase. Subsequently, during an evaluation phase, if the input combination to inputs A, B, C, and D are such that output 1230 resolves to a HIGH logic state, then the precharge state of internal node N5 facilitates a fast rise transition time from LOW to HIGH for output 1230.

One of ordinary skill in the art having the benefit of the instant disclosure will appreciate that a suitable contention interrupt circuit may be designed to replace any complex pull up network of a CMOS logic circuit, or portion thereof, when implementing the CMOS logic circuit with ratioed logic. The logic functions implemented by the above illustrated embodiments are not intended to be limiting; rather only a sampling of possible logic functions implemented using the techniques described herein.

In some cases, a circuit designer may implement a particular CMOS function (e.g., FIGS. 5, 7, 9, and 11) using ratioed logic to increase the operational speed of the particular function. The addition of a contention interrupt circuit reduces downstream signal noise and deterioration by effectively shortening a non-zero output contention level to a brief output contention pulse. When used in connection with domino logic, the PMOS switch controllable by the decoder can be speculatively turned on to allow an internal node between the pull up network and the PMOS switch to charge HIGH, thereby enabling a fast output transition period to HIGH should the output evaluate to a logic HIGH. Furthermore, in some embodiments, the PMOS switch in the contention interrupt circuit may be oversized (e.g., larger than other PMOS switches in the pull up network) without overloading the input signals, since the decoder acts as a buffering stage that reduces the capacitive load seen by the input signals to the ratioed logic gate.

Figure 13:
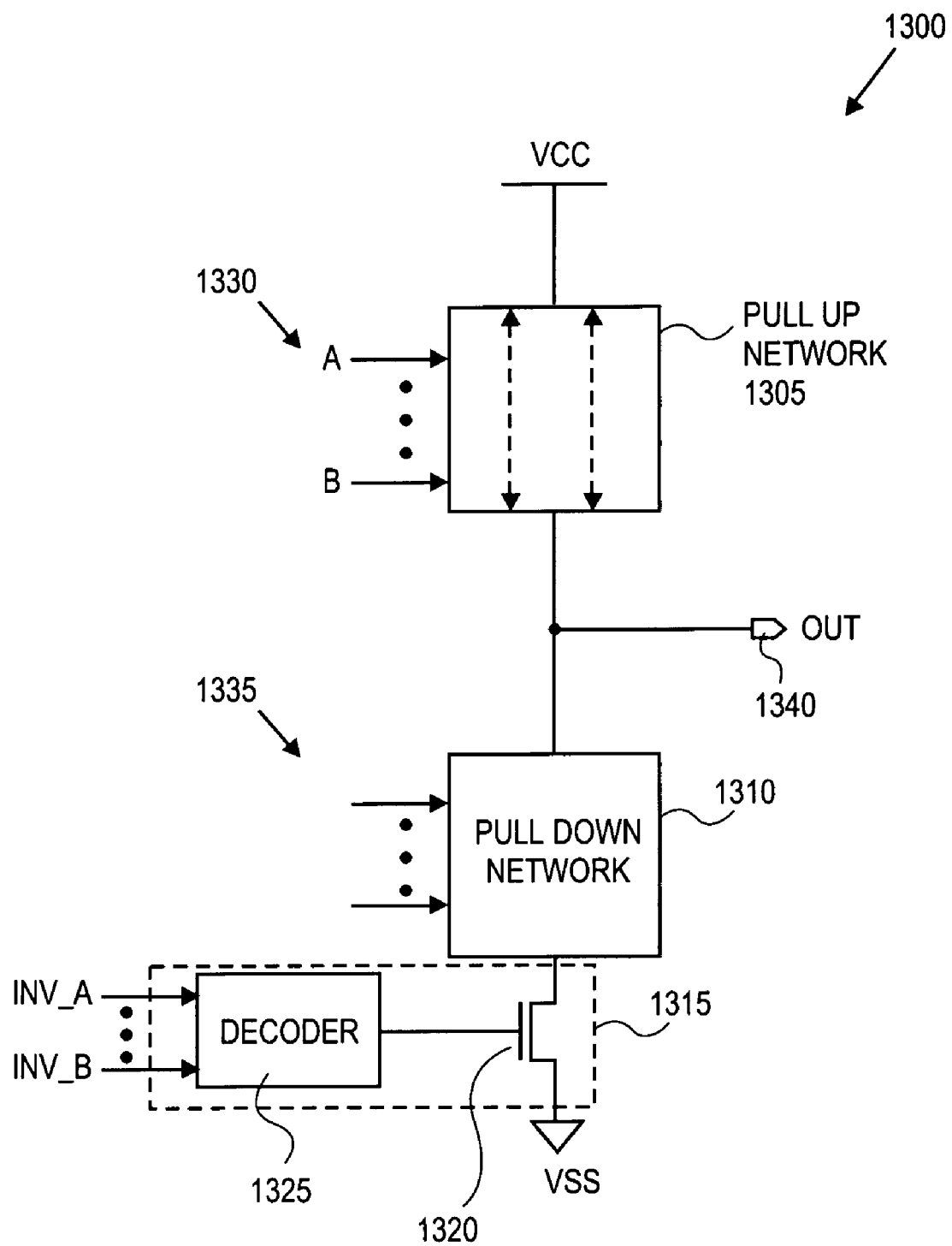
FIG. 13 is a block diagram illustrating a ratioed logic circuit including a contention interrupt circuit coupled to interrupt a pull down network, in accordance with an embodiment of the present invention.

The techniques described herein to disable a pull up path to interrupt a contention state of ratioed P-interrupt logic are equally applicable to ratioed N-interrupt logic. FIG. 13 is a block diagram illustrating a ratioed logic circuit 1300 including a contention interrupt circuit coupled to interrupt a pull down network, in accordance with an embodiment of the present invention. The illustrated embodiment of ratioed logic circuit 1300 includes a pull up network 1305, a pull down network 1310, and a contention interrupt circuit 1315 having a switch 1320 and a decoder 1325.

Pull up network 1305 may include one or more pull up paths having switches therein that are enabled/disabled by inputs 1330. Similarly, pull down network 1310 may include one or more pull down paths that are enable/disabled by inputs 1335. It should be appreciated that one of ordinary skill having the benefit of the instant disclosure may design pull up network 1305 and pull down network 1310 to generate any number of logical functions for output on output 1340 based on inputs 1330 and 1335, as described above.

Similarly as described above, decoder 1325 may be configured to decode inversions of inputs 1330, or a portion thereof. Decoder 1325 decodes contention producing combinations of inputs 1330 and 1335, and open circuits switch 1320 to disable pull down network 1310 and terminate the contention state on output 1340. It should be appreciated that pull up network 1305, pull down network 1310, and contention interrupt circuit 1315 may be designed with the same principles and techniques as described above in connection with logic circuits 200, 600, 800, 1000, and 1200, but applied to ratioed N-interrupt logic. Furthermore, ratioed logic circuit 1300 may also be used in connection with domino logic circuitry as described above.

Figure 14:
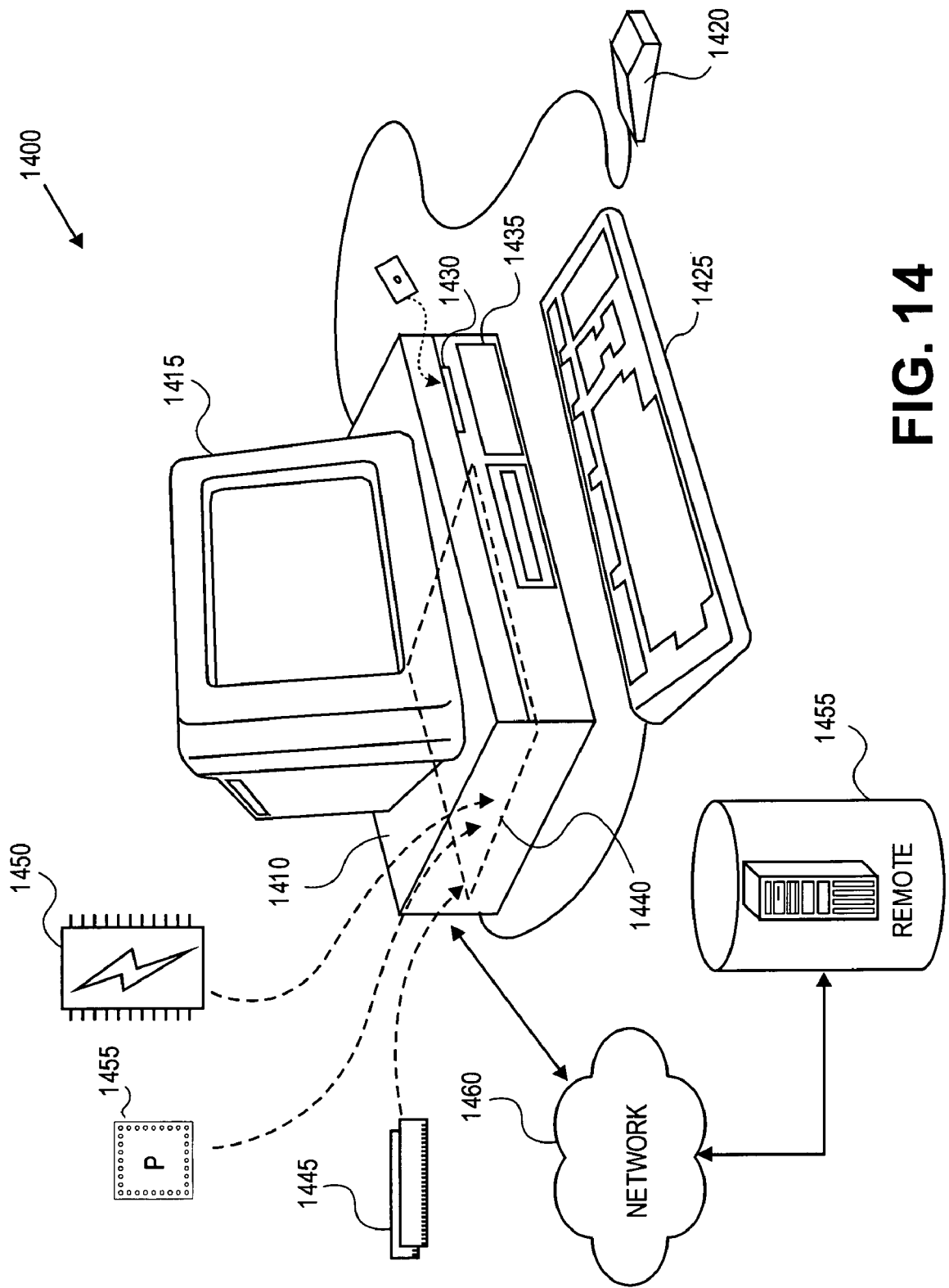
FIG. 14 illustrates a demonstrative system implementing NOR logic gates or various other ratioed logic gates including contention interrupt circuits, in accordance with an embodiment of the present invention.

FIG. 14 is a diagram of a system 1400 that may incorporate one or more of NOR logic gate 200 and ratioed logic circuits 600, 800, 1000, 1200, and 1300, in accordance with embodiments of the present invention. The illustrated embodiment of system 1400 includes a chassis 1410, a monitor 1415, a mouse 1420 (or other pointing device), and a keyboard 1425. The illustrated embodiment of chassis 1410 further includes a floppy disk drive 1430, a hard disk 1435, a compact disc ("CD") and/or digital video disc ("DVD") drive 1437, a power supply (not shown), and a motherboard 1440 populated with appropriate integrated circuits including system memory 1445, nonvolatile ("NV") memory 1450, and one or more processor(s) 1455.

Processor(s) 1455 is communicatively coupled to system memory 1445, NV memory 1450, hard disk 1435, floppy disk drive 1430, and CD/DVD drive 1437 via a chipset on motherboard 1440 to send and to receive instructions or data thereto/therefrom. In one embodiment, NV memory 1450 is a flash memory device. In other embodiments, NV memory 1450 includes any one of read only memory ("ROM"), programmable ROM, erasable programmable ROM, electrically erasable programmable ROM, or the like. In one embodiment, system memory 1445 includes random access memory ("RAM"), such as dynamic RAM ("DRAM"), synchronous DRAM, ("SDRAM"), double data rate SDRAM ("DDR SDRAM") static RAM ("SRAM"), and the like. Hard disk 1435 represents any storage device for software data, applications, and/or operating systems, but will most typically be a nonvolatile storage device. Hard disk 1435 may optionally include one or more of an integrated drive electronic ("IDE") hard disk, an enhanced IDE ("EIDE") hard disk, a redundant array of independent disks ("RAID"), a small computer system interface ("SCSI") hard disk, and the like.

In one embodiment, a network interface card ("NIC") (not shown) is coupled to an expansion slot (not shown) of motherboard 1440. The NIC is for connecting system 1400 to a network 1460, such as a local area network, wide area network, or the Internet. In one embodiment network 1460 is further coupled to a remote computer 1465, such that system 1400 and remote computer 1465 can communicate.

In one embodiment, processor 1455 may include one or more NOR logic gates 200 to execute logical NOR operations. For example, processor 1455 may include an arithmetic logic unit ("ALU") to perform mathematical functions. Embodiments of NOR logic gate 200 may be incorporated into the ALU to implement low noise, high-speed ALU subcomponents. Some such subcomponents may include an ADDER, a MULTIPLIER, and the like implemented using NOR logic gate 200. Additionally, decoder logic within either of system memory 1445, NV memory 1450, hard disk 1435, CD/DVD drive 1437, and floppy drive 1430 may also be implemented using embodiments of NOR logic gate 200.

In some embodiments, processor 1455 may further include one or more ratioed logic circuits 600, 800, 1000, 1200, and 1300 to execute the various logic functions described above. For example, processor 1455 may include an ADDER having a carry out implemented with ratioed logic circuit 1000. Ratioed logic having contention interrupt circuits may be implement in any number of larger circuits, in addition to those listed above, including digital signal processors, video processors, address generation units, shifter/rotators, and the like. In fact, the techniques described herein are well suited to implement any Boolean logic function in high speed.

As described above, NOR logic gate 200 and/or ratioed logic circuits 600, 800, 1000, and 1200 may be incorporated into processor 1455, as well as, various other integrated circuits. Descriptions of NOR logic gate 200 and ratioed logic circuits 600, 800, 1000, and 1200 may be generated and compiled for incorporation into processor 1455 or other various application specific integrated circuits ("ASICs"). For example, behavioral level code describing NOR logic gate 200, or portions thereof, may be generated using a hardware descriptive language, such as VHDL or Verilog, and stored to a machine-accessible medium (e.g., CD-ROM, hard disk, floppy disk, etc.). Furthermore, the behavioral level code can be compiled into register transfer level ("RTL") code, a netlist, or even a circuit layout and stored to a machine-accessible medium. The behavioral level code, the RTL code, the netlist, and the circuit layout all represent various levels of abstraction to describe embodiments of NOR logic gate 200.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An apparatus, comprising:
a pull up path including a positive type MOS ("PMOS") transistor;
multiple pull down paths coupled to the pull up path, wherein at least one of the pull down paths includes a negative type MOS ("NMOS") transistor having a gate coupled to a gate of the PMOS transistor;
multiple inputs coupled to turn the pull down paths on and off;
an output coupled to logically NOR the multiple inputs; and
a contention interrupt circuit coupled to the pull up path to open circuit the pull up path when the pull up path and at least one of the pull down paths are in contention, wherein the contention interrupt circuit includes a switch coupled to the pull up path to open circuit the pull up path and a decoder coupled to control the switch.

2. The apparatus of claim 1, wherein the output is coupled to the multiple pull down paths and the pull up path.

3. The apparatus of claim 2, wherein the decoder comprises a logical NAND gate coupled to logically NAND inversions of at least a portion of the multiple inputs.

4. The apparatus of claim 3, wherein the switch comprises a positive type metal oxide semiconductor ("PMOS") transistor having a gate coupled to an output of the logical NAND gate.

5. The apparatus of claim 3, wherein the pull down paths comprise NMOS transistors each having a gate coupled to one of the multiple inputs.

6. The apparatus of claim 5, wherein the logical NAND gate is coupled to logically NAND inversions of the multiple inputs not coupled to the gate of the PMOS transistor.

7. The apparatus of claim 1, wherein the multiple inputs comprise four inputs and wherein the contention interrupt circuit is coupled to receive three inversions of three of the four inputs, the contention interrupt circuit coupled to open circuit the pull up path in response to a logical NAND of the three inversions.

8. A machine-accessible medium having contained thereon a description of an integrated circuit, the integrated circuit comprising:
a NOR circuit including:
a pull up path including a positive type MOS ("PMOS") transistor;
multiple pull down paths coupled to the pull up path, wherein at least one of the pull down paths includes a negative type MOS ("NMOS") transistor having a gate coupled to a gate of the PMOS transistor;
multiple inputs coupled to turn the pull down paths on and of; and
an output coupled to the multiple pull down paths and the pull up path to logically NOR the multiple inputs; and
a contention interrupt circuit coupled to the pull up path of the NOR circuit to open circuit the pull up path when the pull up path and at least one of the pull down paths are in contention, wherein the contention interrupt circuit includes a switch coupled in series with the pull up path to open circuit the pull up path and a decoder coupled to control the switch.

9. The machine-accessible medium of claim 8, wherein the decoder comprises a logical NAND gate coupled to logically NAND inversions of at least a portion of the multiple inputs.

10. The machine-accessible medium of claim 9, wherein one of the multiple inputs is coupled to both the pull up path and one of the pull down paths to inversely turn on and off the pull up path and the one of the pull down paths.

11. The machine-accessible medium of claim 10, wherein the logical NAND gate is coupled to logically NAND inversions of the multiple inputs not coupled to the pull up path.

12. The machine-accessible medium of claim 9, wherein the multiple inputs comprise four inputs and the pull down paths comprise four pull down paths.

13. A method, comprising:
receiving digital logic signals;
logically NORing the received digital logic signals with a pull up path coupled to multiple pull down paths, wherein the pull down paths include negative type metal oxide semiconductor ("NMOS") transistors each having a gate coupled to one of the digital logical signals and wherein the pull up path includes a positive type MOS ("PMOS") transistor having a gate coupled to one of the gates of the NMOS transistors;
determining whether a contention state exists between the pull up path and at least one of the pull down paths; and
disabling the pull up path when the determining determines that a contention state exits, wherein disabling the pull up path includes open circuiting a switch coupled in series with the PMOS transistor of the pull un path.

14. The method of claim 13, further comprising:
outputting a result of the logical NORing on an output coupled to the pull up path and the pull down paths.

15. The method of claim 14, wherein logically NORing the received digital logic signals comprises:
controlling conductivity of the pull down paths with the received digital logic signals; and
controlling conductivity of the pull up path with one of the digital logic signals.

16. The method of claim 13, wherein determining whether a contention state exists comprises:
inverting at least a portion of the digital logic signals; and
logically NANDing the inverted portion of the digital logic signals.

17. The method of claim 16, inverting at least a portion of the digital logic signals comprises inverting the digital logic signals not controlling conductivity of the pull up path.

18. The method of claim 16, wherein open circuiting the switch coupled in series with the PMOS transistor of the pull up path comprises:
open circuiting the switch in response to the logical NANDing.

19. The method of claim 18, further comprising:
precharging inputs to the logical NORing with domino logic during a precharge phase;
precharging inputs to the logical NANDing to close circuit the switch and precharge an internal node in the pull up path with the domino logic during the precharge phase; and
precharging an internal node between the switch and the pull up path during the precharge phase.

20. A system, comprising:
synchronous dynamic random access memory ("SDRAM"); and
a processor coupled to access the SDRAM, the processor including at least one NOR gaze, the NOR gate including:
a pull up path including a positive type MOS ("PMOS") transistor;
multiple pull down paths coupled to the pull up path, wherein at least one of the pull down paths includes a negative type MOS ("NMOS") transistor having a gate coupled to a gate of the PMOS transistor;
multiple inputs coupled to turn the pull down paths on and off;
an output coupled to logically NOR the multiple inputs; and
a contention interrupt circuit coupled to the pull up path to open circuit the pull up path when the pull up path and at least one of the pull down paths are in contention, wherein the contention interrupt circuit includes a switch coupled to the pull up path to open circuit the pull up path and a decoder coupled to control the switch.

21. The system of claim 20, wherein the decoder comprises a logical NAND gate coupled to logically NAND inversions of at least a portion of the multiple inputs.

22. The system of claim 21, wherein one of the multiple inputs is coupled to both the pull up path and one of the pull down paths to inversely turn on and off the pull up path and the one of the pull down paths.

23. The system of claim 22, wherein the logical NAND gate is coupled to logically NAND inversions of the multiple inputs not coupled to the pull up path.

24. The system of claim 20, wherein the NOR gate is included within an arithmetic logic unit ("ALU") of the processor.

25. An apparatus, comprising:
a pull up network;
multiple pull down paths coupled to the pull up network;
multiple inputs coupled to the pull down paths to turn the pull down paths on and off and a first portion of the multiple inputs coupled to the pull up network to turn the pull up network on and off;
an output coupled to the pull up network and to the multiple pull down paths to generate a logical function of the multiple input; and
a contention interrupt circuit coupled to the pull up network to open circuit the pull up network based on decoding inversions of a second portion of the multiple inputs not coupled to the pull up network when the pull up network and at least one of the pull down paths are in contention.

26. The apparatus of claim 25, wherein the contention interrupt circuit comprises:
a switch coupled in series with the pull up network to open circuit the pull up network; and
a decoder coupled to control the switch, the decoder coupled to receive the inversions of the second portion of the multiple inputs not coupled to the pull up network.

27. The apparatus of claim 26, wherein logical function comprises a logical NOR of the multiple inputs and wherein the decoder comprises a logical NAND gate coupled to logically NAND inversions of the second portion of the multiple inputs not coupled so the pull up network.

28. The apparatus of claim 26, wherein the logical function comprises OUT=$\overline{(A \cdot B)+(C \cdot D)}$, where OUT represents an output signal generated on the output, A, B, C, and D represent input signals received on the multiple inputs, "+" represents a logical OR, and "·" represents a logical AND, and wherein the decoder comprises a logical NOR gate coupled to logically NOR inversions of the portion of the multiple inputs not coupled to the pull up network.

29. The apparatus of claim 26, wherein the logical function comprises OUT=$\overline{(A \cdot B)+(C \cdot D)+(E \cdot F)}$, where OUT represents an output signal generated on the output, A, B, C, D, E, and F represent input signals received on the multiple inputs, "+" represents a logical OR, and "·" represents a logical AND.

30. The apparatus of claim 29, wherein the decoder comprises:
two parallel pull down paths coupled between a gate terminal of the switch and VSS, the parallel pull down paths enabled and disabled in response to inversions of input signals C, D, E, and F; and
two parallel pull up paths coupled between the gate terminal of the switch and VCC, the parallel pull up paths enabled and disabled in response to inversions of inputs signals C, D, E, and F.

31. The apparatus of claim 26, wherein the logical function comprises OUT=$\overline{A+(B \cdot C)}$, where OUT represents an output signal generated on the output, A, B, and C represent input signals received on the multiple inputs, "+" represents a logical OR, and "·" represents a logical AND, and wherein the decoder comprises a logical inverter coupled to logically invert an inversion of one of the multiple inputs.

32. The apparatus of claim 26, wherein the logical function comprises OUT=$\overline{A+(B \cdot C)+D}$, where OUT represents an output signal generated on the output, A, B, C, and D represent input signals received on the multiple inputs, "+" represents a logical OR, and "·" represents a logical AND, and wherein the decoder comprises a logical NAND gate coupled to logically NAND the inversions of the second portion of the multiple inputs not coupled to the pull up network.

33. A method, comprising:
receiving digital logic signals;
applying a logical function to the received digital logic signals with a pull up network coupled to multiple pull down paths, each of the multiple pull down paths ratioed to overcome the pull up network in contention, wherein a first group of the received digital logic signals selectively enable and disable the pull up network and a second group of the received digital logic signals selectively enable and disable the pull down path;
determining whether a contention state exists between the pull up network and at least one of the pull down paths based only on inversions of the received digital logic signals not coupled to selectively enable and disable the pull up network; and
disabling the pull up network when the determining determines that a contention state exits.

34. The method of claim 33, further comprising:
outputting a result of the logical function on an output coupled to the pull up network and the pull down paths.

35. The method of claim 34, wherein disabling the pull up network comprises open circuiting a switch coupled in series with the pull up network in response to a decoder circuit coupled to determine whether the contention state exists.

36. The method of claim 35, further comprising:
precharging inputs coupled to enable and disable the pull up network and the pull down paths to a logic HIGH with domino logic during a precharge phase;
precharging inputs to the decoder circuit to the logic HIGH with the domino logic during the precharge phase;
speculatively precharging an internal node between the switch and the pull up network to the logic HIGH; and
evaluating the received digital logic signals during an evaluation phase to output the result of the logical function.

37. The method of claim 35, wherein the logical function comprises a logical NOR function and wherein determining whether a contention state exists comprises:
inverting at least a portion of the digital logic signals; and
logically NANDing the inverted portion of the digital logic signals.

38. The method of claim 35, wherein the logical function comprises $\overline{(A \cdot B)+(C \cdot D)}$, where A, B, C, and D represent the received digital logic signals, "+" represents a logical OR, and "·" represents a logical AND, and wherein determining whether a contention state exists comprises:
inverting at least a portion of the digital logic signals; and
logically NORing the inverted portion of the digital logic signals.

39. The method of claim 35, wherein the logical function comprises $\overline{(A \cdot B)+(C \cdot D)+(E \cdot F)}$, where A, B, C, D, E, and F represent the received digital logic signals, "+" represents a logical OR, and "·" represents a logical AND, and wherein determining whether a contention state exists comprises:
inverting the received digital logic signals C, D, E, and F; and
controlling conductivity of two parallel pull down paths coupled to two parallel pull up paths with the inverted received digital logic signals C, D, E, and F.

40. The method of claim 35, wherein the logical function comprises $\overline{A+(B \cdot C)}$, where A, B, and C represent the received digital logic signals, "+" represents a logical OR, and "·" represents a logical AND, and wherein determining whether a contention state exists comprises:
inverting one of the digital logic signals; and
inverting the inverted one of the digital logic signals.

41. The method of claim 35, wherein the logical function comprises $\overline{A+(B \cdot C)+D}$, where A, B, C, and D represent the received digital logic signals, "+" represents a logical OR, and "·" represents a logical AND, and wherein determining whether a contention state exists comprises:
inverting a portion of the digital logic signals; and
logically NANDing the inverted portion of the digital logic signals.

42. An apparatus, comprising:
a pull up network;
a pull down network coupled to the pull up network;
multiple inputs coupled to turn the pull up network on and off;
an output coupled to the pull up network and to the pull down network to generate a logical function of the multiple inputs, wherein the pull up network and the pull down network are ratioed such that the pull up network will pull the output towards a logic HIGH when in contention with the pull down network; and
a contention interrupt circuit coupled to the pull down network to open circuit the pull down network when the pull down network and the pull up network are in contention.

43. The apparatus of claim 42, wherein the contention interrupt circuit comprises:
a switch coupled in series with the pull down network to open circuit the pull down network; and
a decoder coupled to control the switch, the decoder coupled to receive at least one inversion of at least one of the multiple inputs.

44. A method, comprising:
receiving digital logic signals;
applying a logical function to the received digital logic signals with a pull down network coupled to multiple pull up paths, each of the multiple pull up paths ratioed to overcome the pull down network in contention;

determining whether a contention state exists between the pull down network and at least one of the pull up paths; and disabling the pull down network when the determining determines that a contention state exits.

45. The method of claim 44, comprising:

outputting a result of the logical function on an output coupled to the pull down network and to the pull up paths.

46. The method of claim 45, wherein disabling the pull down network comprises open circuiting a switch coupled in series with the pull down network in response to a decoder circuit coupled to determine whether the contention state exists.

* * * * *